United States Patent
Pakimo et al.

(10) Patent No.: US 11,622,465 B2
(45) Date of Patent: Apr. 4, 2023

(54) FIELD TERMINATION ASSEMBLY (FTA) WITH DAMPENED MOUNT

(71) Applicant: Honeywell International Inc., Morris Plaines, NJ (US)

(72) Inventors: Dawa Pakimo, Bangalore (IN); Jaison Cherian, Bangalore (IN); Peter Vermaas, Nieuw-Amsterdam (NL)

(73) Assignee: Honeywell International Inc., Charlotte, NC (US)

( * ) Notice: Subject to any disclaimer, the term of this patent is extended or adjusted under 35 U.S.C. 154(b) by 587 days.

(21) Appl. No.: 16/776,251

(22) Filed: Jan. 29, 2020

(65) Prior Publication Data

US 2020/0253076 A1    Aug. 6, 2020

(51) Int. Cl.
| | |
|---|---|
| *G06F 1/16* | (2006.01) |
| *H05K 5/00* | (2006.01) |
| *H05K 7/00* | (2006.01) |
| *H05K 7/14* | (2006.01) |

(52) U.S. Cl.
CPC ......... *H05K 7/1474* (2013.01); *H05K 7/1465* (2013.01); *H05K 7/1467* (2013.01)

(58) Field of Classification Search
CPC ... H05K 7/1474; H05K 7/1465; H05K 7/1467
See application file for complete search history.

(56) References Cited

U.S. PATENT DOCUMENTS

| | | | |
|---|---|---|---|
| 4,758,928 A | 7/1988 | Wierec | |
| 5,043,847 A * | 8/1991 | Deinhardt | H05K 7/1469 361/736 |
| 5,253,140 A * | 10/1993 | Inoue | H05K 7/1468 361/728 |
| 5,764,598 A | 6/1998 | Sundstrom | |
| 5,812,377 A | 9/1998 | Gulbach | |
| 6,128,187 A | 10/2000 | Mimlitch | |
| 6,172,876 B1 * | 1/2001 | Benson, Jr. | H05K 7/1467 361/753 |
| 6,311,229 B1 * | 10/2001 | Burchard | H05K 7/1455 361/600 |
| 6,551,111 B1 * | 4/2003 | Watanabe | H01R 9/223 439/11 |
| 6,561,835 B1 | 5/2003 | Hirschberg | |
| 7,848,827 B2 | 12/2010 | Chen | |
| 9,795,046 B2 * | 10/2017 | Bury | H05K 7/1477 |
| 9,992,898 B2 * | 6/2018 | Tsutsumi | H05K 7/1481 |
| 2016/0286679 A1 * | 9/2016 | Bury | H05K 7/1478 |
| 2019/0104633 A1 * | 4/2019 | Ross | H05K 7/1468 |

* cited by examiner

*Primary Examiner* — Anthony M Haughton
(74) *Attorney, Agent, or Firm* — Paschall & Associates, LLC; James C. Paschall

(57) ABSTRACT

This disclosure provides a field termination assembly (FTA) providing for ease of mounting to a support rail. The FTA provides a lever on a base that cushions against shocks and vibrations during shipment and operation while a housing is mounted on a base secured to a support rail. The base includes a dampener feature which makes it more capable of meeting operation and transportation vibration and shock requirements even for marine applications while still providing high channel density and cable count.

19 Claims, 12 Drawing Sheets

FIELD TERMINATION ASSEMBLY (FTA) WITH DAMPENED MOUNT

CROSS-REFERENCE TO RELATED APPLICATIONS

This application claims priority from Indian Provisional Application 201911003912, filed Jan. 31, 2019, incorporated herein in its entirety.

TECHNICAL FIELD

This disclosure generally relates to input/output (I/O) systems. More specifically, this disclosure relates to a field termination assembly (FTA) for dampened mounting to a support rail.

BACKGROUND

Industrial process control and automation systems are often used to automate large and complex industrial processes. These types of systems routinely include various components including sensors, actuators, and controllers. Some of the controllers can receive measurements from the sensors, possibly through connected input/output (I/O) subsystems and generate control signals for the actuators. Existing process control and automation systems typically have hardware components participating in control and I/O functions that are installed in control rooms and in the field. These hardware components are often used to gather I/O information from the field, transmit that I/O information to the control rooms, perform various control functions, and transmit I/O information back to the field.

SUMMARY

This disclosure provides a field termination assembly (FTA) that absorbs impact in an assembled mode during shipping and use. Shipping the FTA in a marshalling cabinet in a mounted condition may reduce assembly time. However, due to the higher channel density and cable count a conventional FTA may not pass transportation and operational vibration and shock requirements. Operational requirements may be particularly challenging for marine applications. As a result, FTA's can be prone to damage during operation and shipment in a mounted condition. A dampened FTA base includes a dampener feature which cushions the vibrations in the cabinet being transferred to the FTA and make it more capable for meeting operation and transportation vibration and shock requirements even for marine applications while still providing high channel density and cable count.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
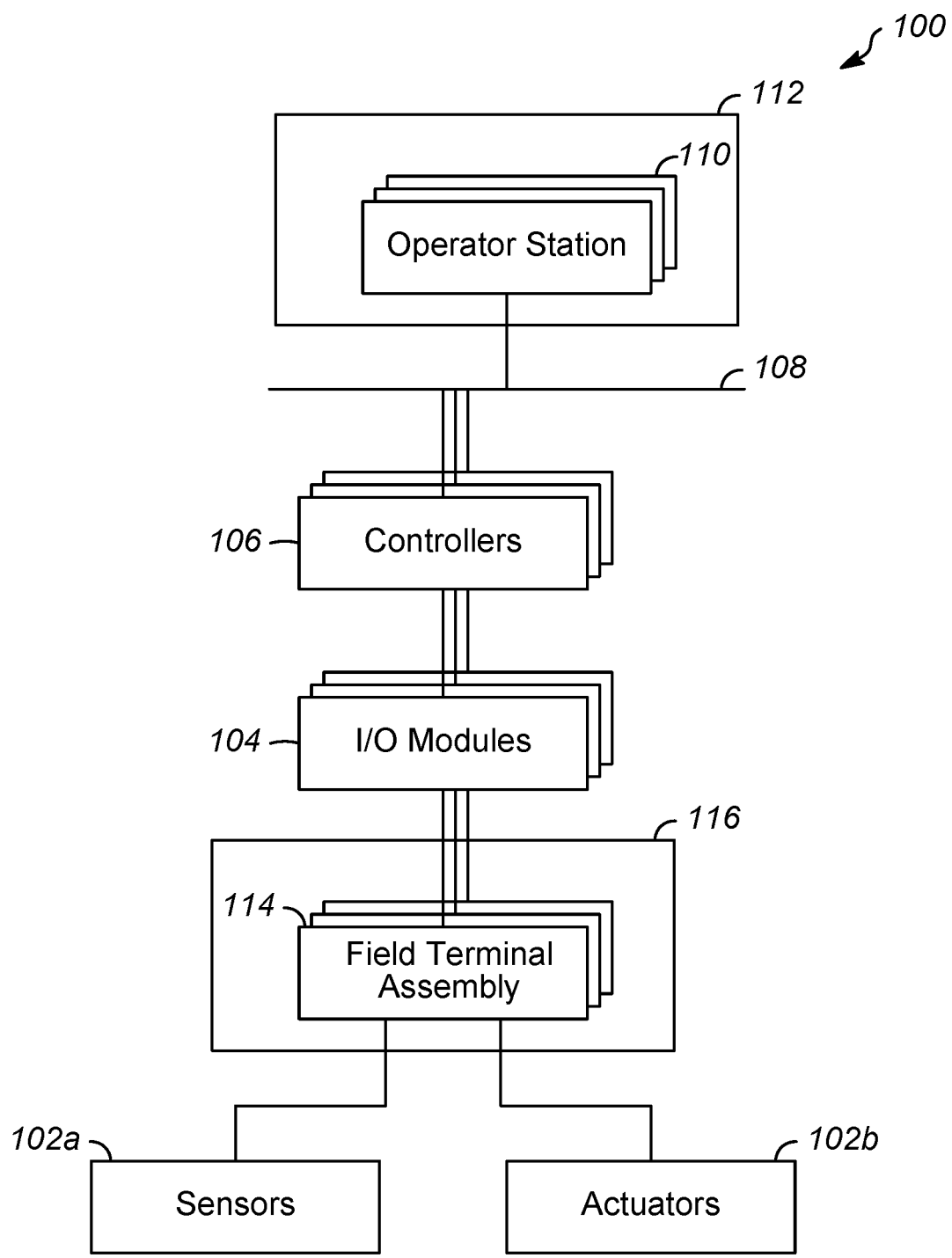
FIG. 1 illustrates an exemplary industrial process control and automation system according to this disclosure.

FIG. 1, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

As noted above, industrial process control and automation systems typically have hardware components participating in various control and input/output (I/O) functions. Marshaling cabinets have been used to gather the various components used for communicating over I/O channels into a single location. Often times, the various components are arranged serially, with different columns of equipment performing different functions and components in the different columns connected by wiring.

This disclosure describes a field termination assembly (FTA) that integrates signal conditioning hardware and other hardware for multiple I/O channels into a single structure. The FTA is suitable for use in marshaling cabinets or other locations for industrial process control and automation systems or other systems. One or multiple FTAs can be used in a marshaling cabinet or other structure. The integration of different signal conditioning and hardware functions together into an FTA helps to achieve improved channel densities, lower overall hardware footprints, lower solution costs, and improved usability.

FIG. 1 illustrates an exemplary industrial process control and automation system 100 according to this disclosure. As shown in FIG. 1, the system 100 includes various components that facilitate production or processing of at least one product or other material. For instance, the system 100 can be used to facilitate control or monitoring of components in one or multiple industrial plants. Each plant represents one or more processing facilities (or one or more portions thereof), such as one or more manufacturing facilities for producing at least one product or other material. In general, each plant may implement one or more industrial processes and can individually or collectively be referred to as a process system. A process system generally represents any system or portion thereof configured to process one or more products or other materials or energy in different forms in some manner.

In the example shown in FIG. 1, the system 100 includes one or more sensors 102a and one or more actuators 102b. The sensors 102a and actuators 102b represent components in a process system that may perform any of a wide variety of functions. For example, the sensors 102a could measure a wide variety of characteristics in the process system, such as temperature, pressure, or flow rate. Also, the actuators 102b could alter a wide variety of characteristics in the process system. Each of the sensors 102a includes any suitable structure for measuring one or more characteristics in a process system. Each of the actuators 102b includes any suitable structure for operating on or affecting one or more conditions in a process system.

At least one I/O module 104 is coupled to the sensors 102a and actuators 102b. The I/O modules 104 facilitate interactions with the sensors 102a, actuators 102b, or other field devices. For example, an I/O module 104 could be used to receive one or more analog inputs (AIs), digital inputs (DIs), digital input sequences of events (DISOEs), pulse accumulator inputs (PIs), or other inputs from one or more field devices. An I/O module 104 could also be used to provide one or more analog outputs (AOs), digital outputs (DOs), or other outputs to one or more field devices. As described below, the interactions with one or more field devices occur through one or more field termination assemblies 114. Each I/O module 104 includes any suitable structure(s) for receiving one or more input signals from or providing one or more output signals to one or more field devices.

The system 100 also includes various controllers 106. The controllers 106 can be used in the system 100 to perform various functions in order to control one or more industrial processes. For example, a first set of controllers 106 may use measurements from one or more sensors 102a to control the operation of one or more actuators 102b. These controllers 106 could interact with the sensors 102a, actuators 102b, and other field devices via the I/O modules 104. A second set of controllers 106 could be used to optimize the control logic or other operations performed by the first set of controllers. A third set of controllers 106 could be used to perform additional functions. It is also possible that one set of controllers could be in a stand-by or load sharing mode to improve overall availability of the system.

Controllers 106 are often arranged hierarchically in a system. For example, different controllers 106 could be used to control individual actuators, collections of actuators forming machines, collections of machines forming units, collections of units forming plants, and collections of plants forming an enterprise. The controllers 106 in different hierarchical levels can communicate via one or more networks 108 and associated switches, firewalls, and other components.

Each controller 106 includes any suitable structure for controlling one or more aspects of an industrial process. At least some of the controllers 106 could, for example, represent proportional-integral-derivative (PID) controllers or multivariable controllers, such as Robust Multivariable Predictive Control Technology (RMPCT) controllers or other types of controllers implementing model predictive control (MPC) or other advanced predictive control. As a particular example, each controller 106 could represent a computing device running a real-time operating system, a WINDOWS operating system, or other operating system.

The one or more networks 108 couple the controllers 106 and other devices in the system 100. The network 108 facilitates the transport of information between components. The network 108 could represent any suitable network or combination of networks. As particular examples, the network 108 could represent at least one Ethernet network.

Operator access to and interaction with the controllers 106 and other components of the system 100 can occur via various operator stations 110. Each operator station 110 could be used to provide information to an operator and receive information from an operator. For example, each operator station 110 could provide information identifying a current state of an industrial process to an operator, such as values of various process variables and warnings, alarms, or other states associated with the industrial process. Each operator station 110 could also receive information affecting how the industrial process is controlled, such as by receiving setpoints for process variables controlled by the controllers 106 or other information that alters or affects how the controllers 106 control the industrial process. Each operator station 110 includes any suitable structure for displaying information to and interacting with an operator.

Multiple operator stations 110 can be grouped together and used in one or more control rooms 112. Each control room 112 could include any number of operator stations 110 in any suitable arrangement. In some embodiments, multiple control rooms 112 can be used to control an industrial plant, such as when each control room 112 contains operator stations 110 used to manage a discrete part of the industrial plant.

The foregoing represents a brief description of one type of industrial process control and automation system that may be used to manufacture or process one or more materials. Additional details regarding industrial process control and automation systems are well-known in the art and are not needed for an understanding of this disclosure. Also, industrial process control and automation systems are highly configurable and can be configured in any suitable manner according to particular needs.

In particular embodiments, the various controllers 106 and operator stations 110 in FIG. 1 may represent computing devices. For example, each of the controllers and operator stations could include one or more processing devices, such as one or more microprocessors, microcontrollers, digital signal processors (DSPs), field programmable gate arrays (FPGAs), application specific integrated circuits (ASICs), or discrete circuitry. Each of the controllers 106 and operator stations 110 could also include one or more memories for storing instructions and data used, generated, or collected by the processing device(s), such as a random access memory, read only memory, Flash memory, optical disc, hard drive, or any other suitable volatile or non-volatile storage device(s). Each of the controllers 106 and operator stations 110 could further include at least one network interface, such as one or more Ethernet interfaces or wireless transceivers.

In process control and automation systems such as the system 100, I/O channels are used to connect controllers (such as the controllers 106) and field devices (such as the sensors 102a and actuators 102b). In general, the I/O modules 104 or other devices can support I/O channels of various types, including AIs, DIs, DISOEs, PIs, AOs, or DOs. Different I/O channel types are characterized by different inputs, outputs, voltages, currents, and configurations. A universal I/O (UIO) channel is a specialized I/O channel that is reconfigurable to operate as any of multiple I/O channel types. Example types of UIO circuits are shown in U.S. Pat. Nos. 8,072,098; 8,392,626; 8,656,065; and U.S. Patent Publication No. 2015/0278144. UIO circuits that support UNIVERSAL CHANNEL TECHNOLOGY available from HONEYWELL INTERNATIONAL INC. are also suitable for use.

As described in more detail below, at least one field termination assembly 114 can be used in the system 100 or other system. Each field termination assembly 114 includes a backplane with one or more slots configured to receive one or more adaptor modules for one or more I/O channels (such as sixteen I/O channels, although other numbers of I/O channels can be supported). Each of the adaptor modules performs one or more functions related to I/O signals, such as signal conditioning, energy limiting, galvanic isolation, or protection (or any combination thereof). Here, the adaptor modules can operate independently, meaning each adaptor module can perform its function(s) for its I/O channel regardless of whether other adaptor modules are present or what those other adaptor modules are doing. Each field termination assembly 114 also includes electrical terminals (such as screw terminals) allowing the field termination assembly 114 to be coupled to field cables that electrically connect the field termination assembly 114 to one or more field devices. In some embodiments, the field termination assembly 114 can include at least two electrical terminals per field device. In particular embodiments, the field termination assembly 114 can include at least three electrical terminals per field device, and the field termination assembly 114 can automatically sense the number of wires used to communicate with each field device. This may allow, for instance, the field termination assembly 114 to be coupled to two-wire, three-wire, or other field devices seamlessly.

Although FIG. 1 illustrates one example of an industrial process control and automation system 100, various changes may be made to FIG. 1. For example, the system 100 could include any number of sensors, actuators, I/O modules, controllers, operator stations, networks, field termination assemblies, and other components. Also, the makeup and arrangement of the system 100 in FIG. 1 is for illustration only. Components could be added, omitted, combined, or placed in any other suitable configuration according to particular needs. Further, particular functions have been described as being performed by particular components of the system 100. This is for illustration only. In general, control and automation systems are highly configurable and can be configured in any suitable manner according to particular needs. In addition, FIG. 1 illustrates one example operational environment in which one or more field termination assemblies can be used. This functionality can be used in any other suitable system, and the system need not be related to industrial process control and automation.

Figure 2:
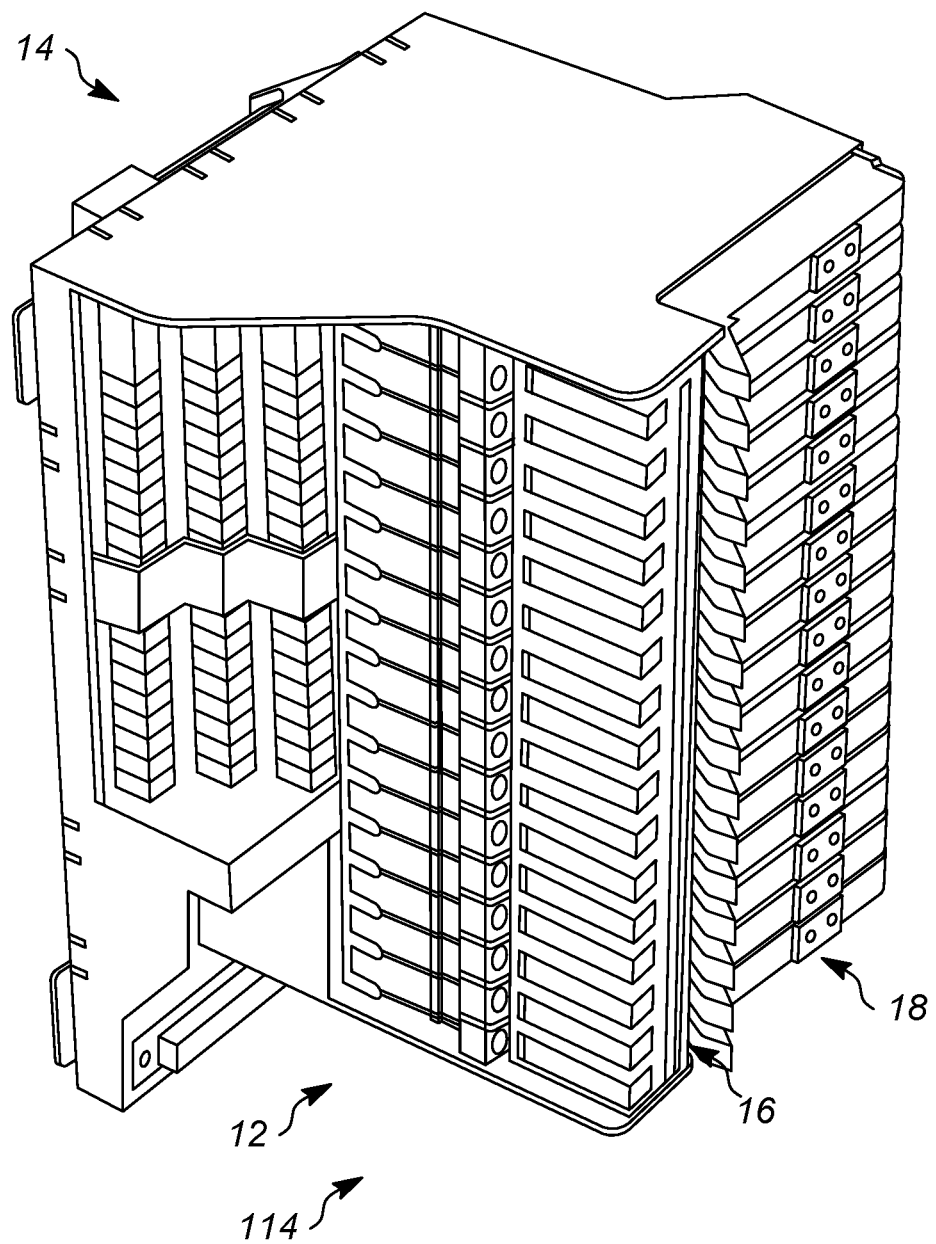
FIGS. 2-16 illustrate embodiments described in the following Detailed Description.
Figure 3:
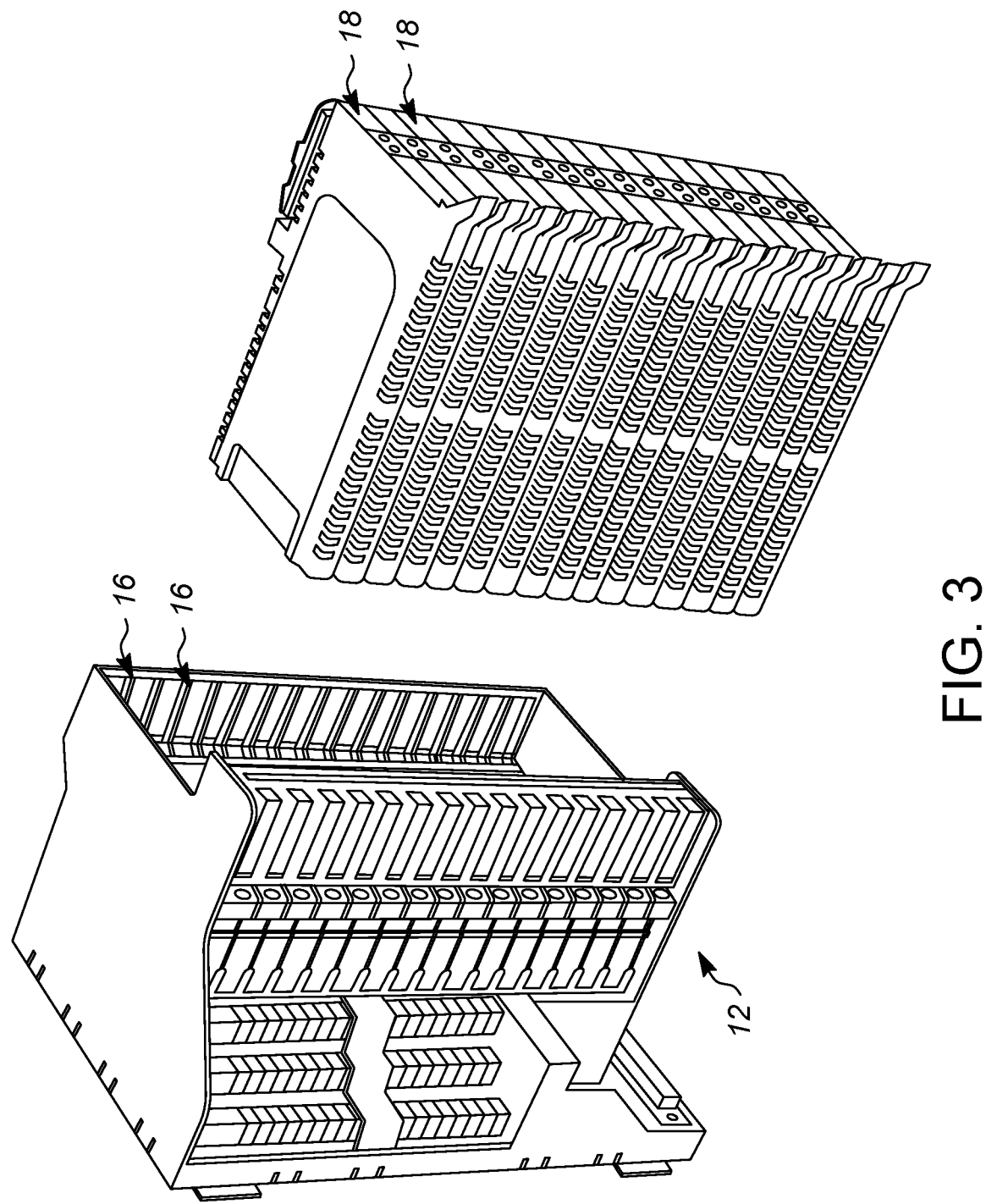
Figure 4:
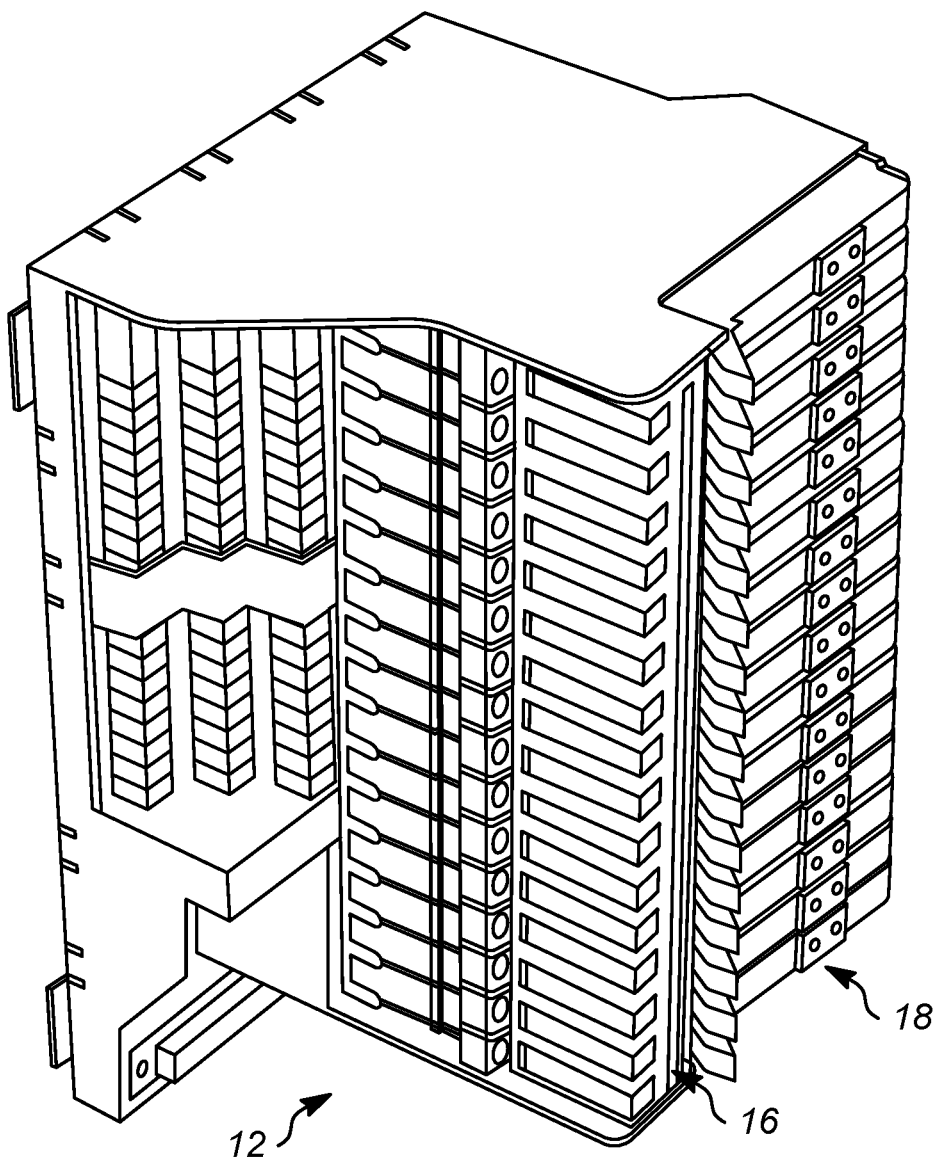
Figure 5:
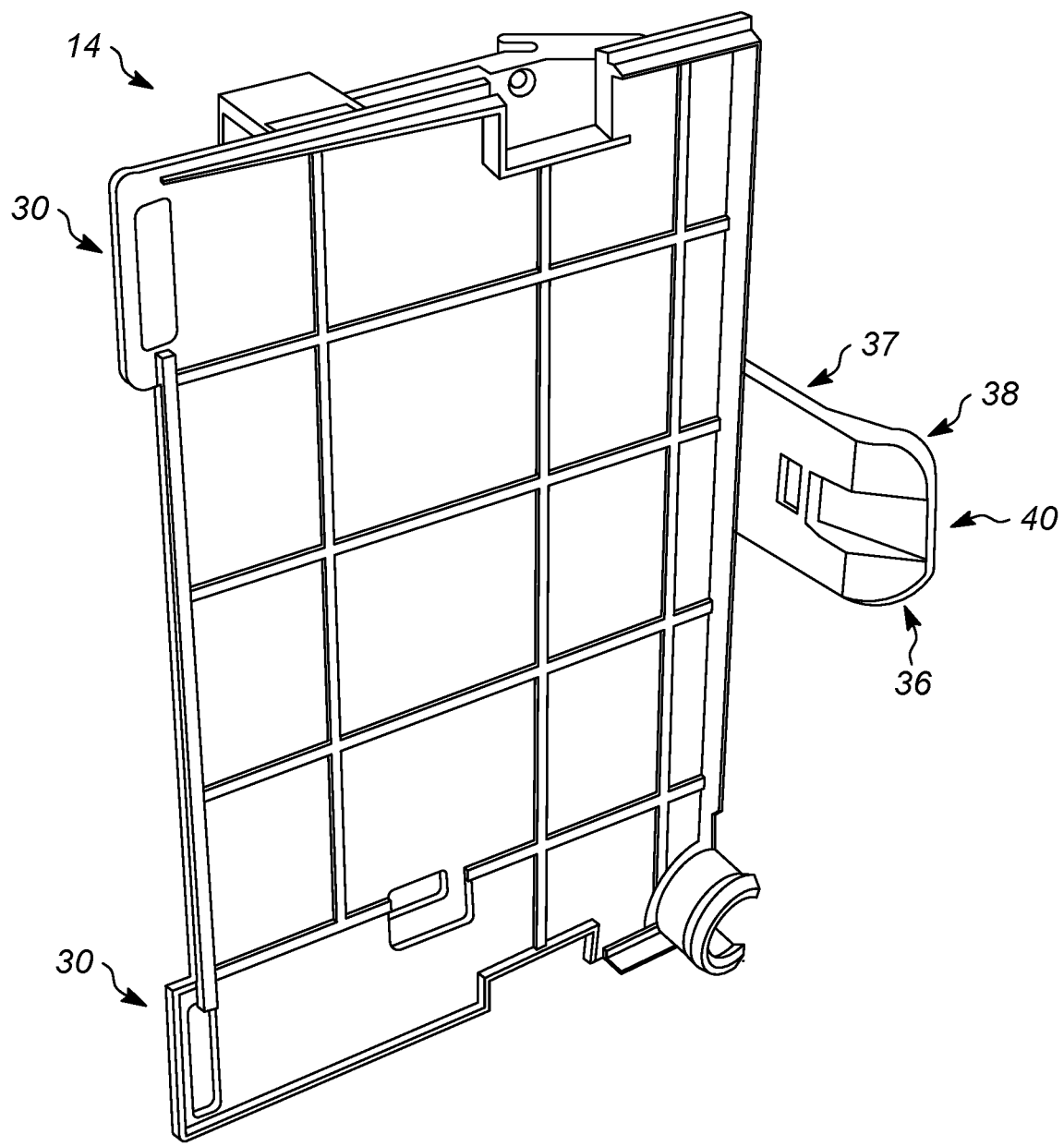

FIG. 2 depicts a field termination assembly 114 comprising a housing 12 shown in FIGS. 2, 3 and 4 and a base 14 shown in FIGS. 2 and 5. FIG. 3 depicts the housing 12 separate from a plurality of adaptor modules 18. The housing 12 includes one or a plurality of slots 16. Each slot 16 may be configured to receive a respective adaptor module 18 of the plurality of adaptor modules configured to be inserted into the slot 16. The adaptor module 18 may be configured to perform at least one function related to an associated input or output signal.

FIGS. 2 and 4 depict the field termination assembly 114 with the respective adaptor module 18 in each slot 16. The housing 12 is configured to be mounted to the base 14. The base 14 is shown disassembled from the housing 12 in FIGS. 5 and 6, and the housing 12 is shown disassembled from the base 14 in FIGS. 3, 4 and 6.

Figure 6:
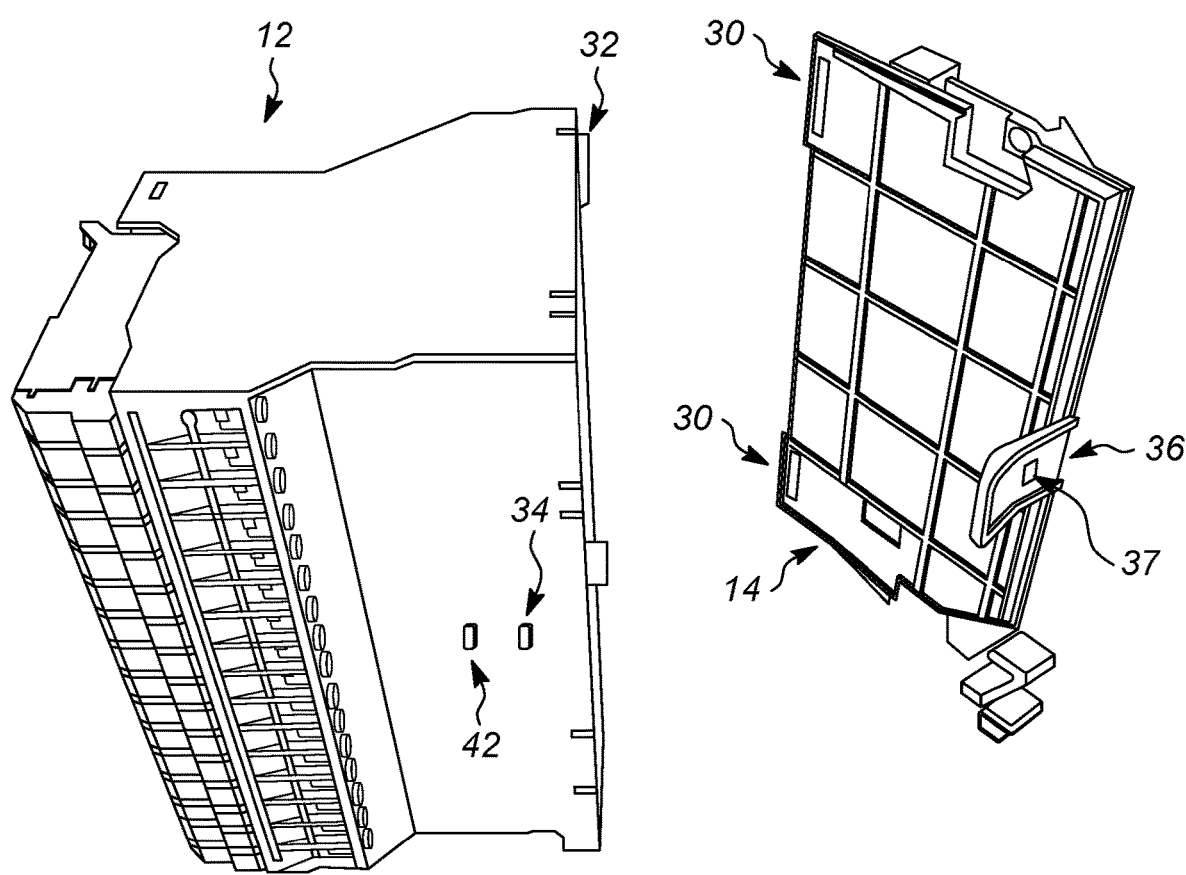

Turning to FIGS. 5 and 6, the base 14 includes a loop 30 comprising an opening projecting from its front edge. The base 14 may include two such loops 30 projecting from its front edge at the corners. The housing 12 includes a catch 32 that may engage the loop 30 to hingeably couple the base 14 to the housing. The housing 12 may have two such catches 32, each having a position and configuration corresponding to a respective loop 30 on the base 14. The housing 12 may include a hitch 34 that may be located on its back side on a side opposite the catches 32. The base 14 may include a latch 36 comprising an aperture 37. The latch may project orthogonally from the back edge opposite to the front edge from which the loops 30 project. The latch 36 is configured such that the aperture 37 engages the 34 hitch to mount the housing 12 to the base 14 in a latched arrangement.

Figure 7:
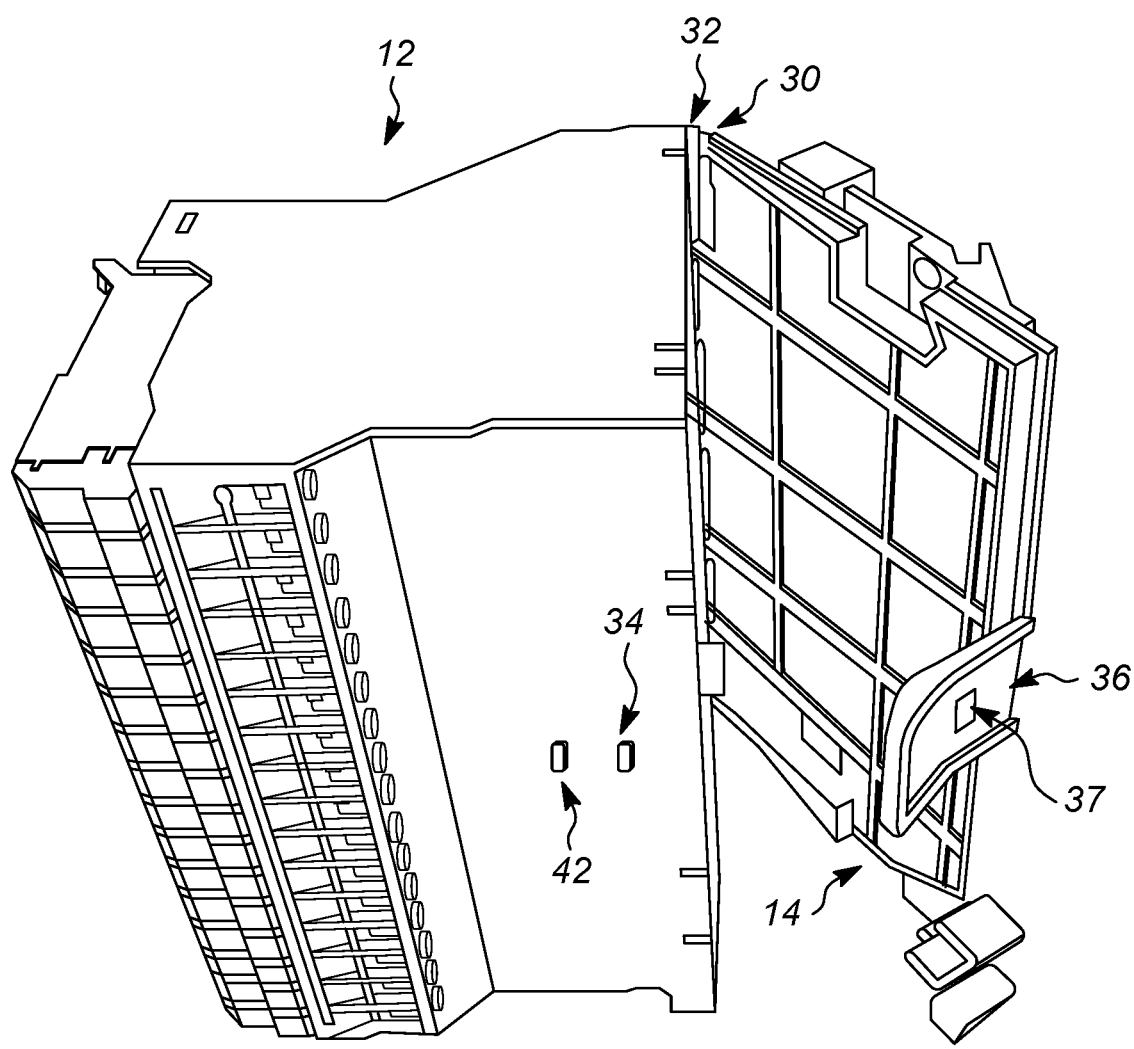
Figure 8:
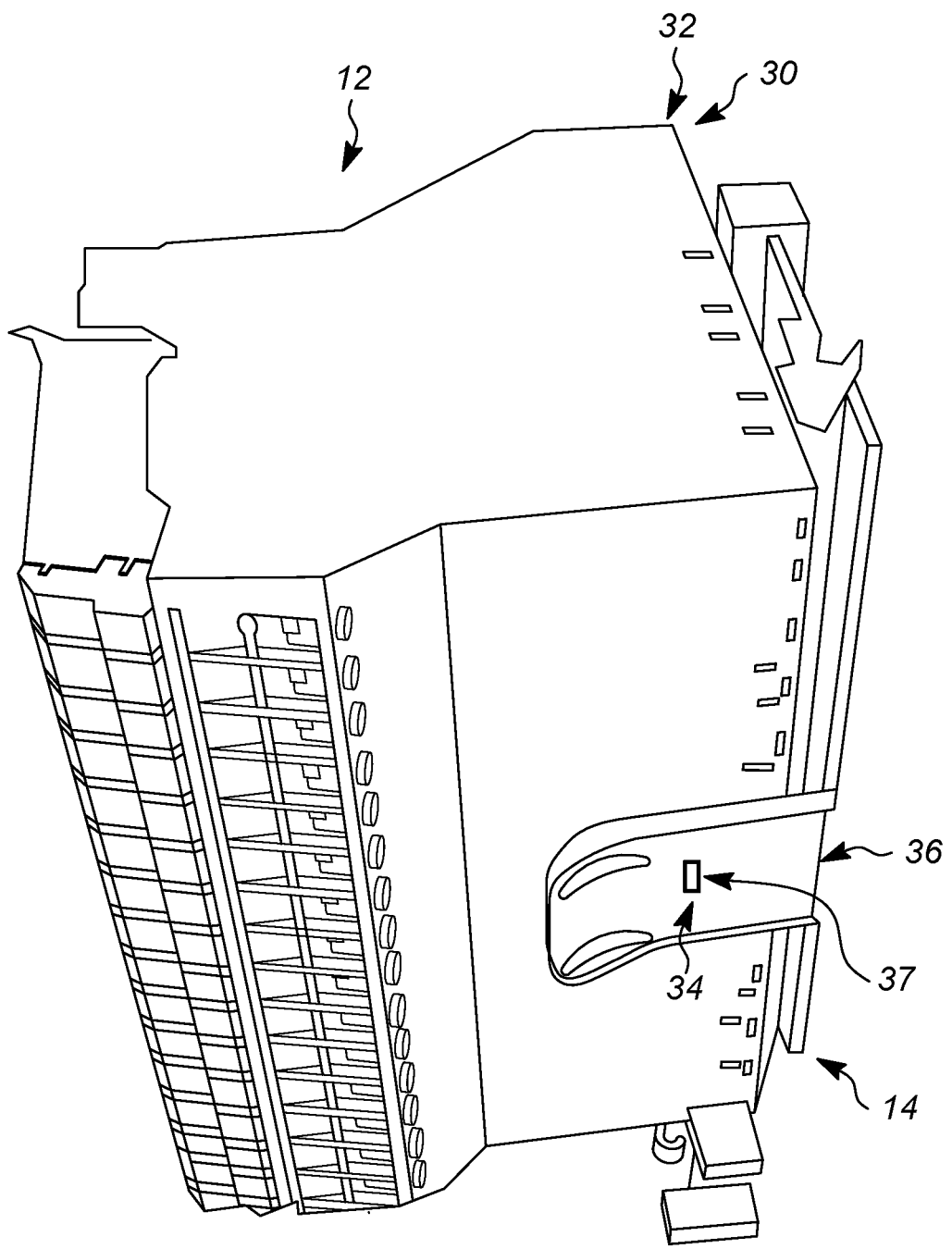

The housing 12 and the base 14 are movable between a first coupled position shown in FIG. 7 to a second mounted position shown in FIG. 8. The catch 32 on the housing extends through a respective loop 30 on the base 14 to engage the loop 30 in a first coupled position. In an aspect, two catches 32 on the housing 12 extend through corresponding respective loops 30 on the base 14 to engage the loop 30 in a first coupled position shown in FIG. 7. The catches 32 move in the loops 30 of the housing 12, such that the housing 12 and the base 14 pivot with respect to each other about the catch 32 into a second mounted position in which the hitch 34 snaps into the aperture 37 on the latch 36 thereby latching the housing 12 to the base 14 as shown in FIG. 8. Similarly, the latch 36 can be disengaged from the hitch 34 and the housing 12 and base pivoted away from each other about the catch 32 to move from the mounted position to the coupled position. The catches 32 can be removed from the loops 30 as shown in FIG. 6 to readily remove the housing 12 from the base 14. Hence, the housing 12 is readily snap-mounted onto the base 14, and the housing is readily dismounted from the base without the need for hand tools. Pivoting preferably occurs along the front edge of the housing 12 and the base 14.

As shown best in FIG. 5, the latch 36 includes a beveled distal edge 38 to facilitate engagement with the hitch 34 (FIG. 6). The latch 36 includes a recessed track 40 along which the hitch 34 rides into the aperture 37 to engage the latch. In an aspect, the housing includes a lug 42 (FIG. 6) at a higher elevation and height on the back wall of the housing 12 than the hitch 34. The lug 42 can engage the recessed track 40 and deflect the latch 36 away from the hitch 34 until the hitch aligns with the aperture 37 to enable the latch 36 to snap onto the hitch 34 such that the hitch 34 protrudes through the aperture 37.

Figure 10:
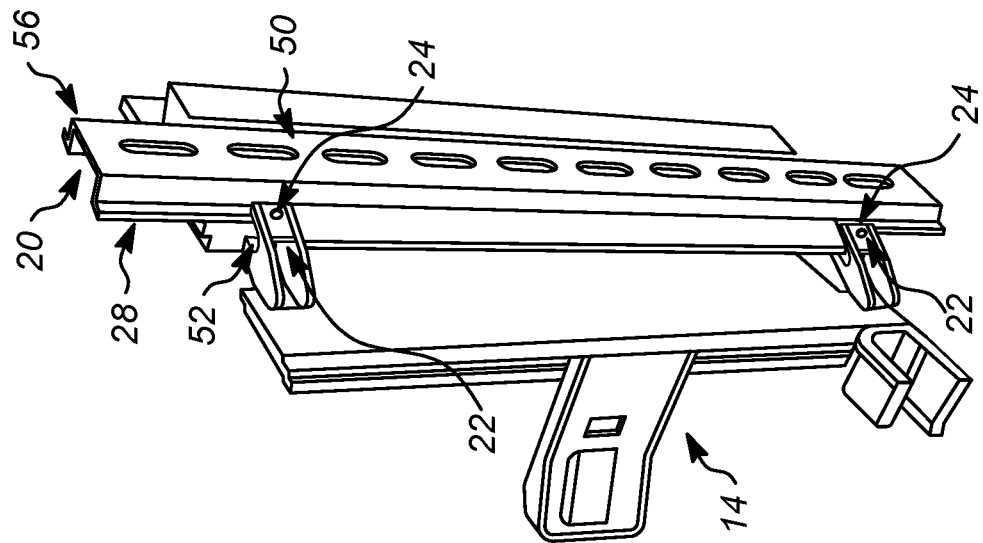
Figure 9:
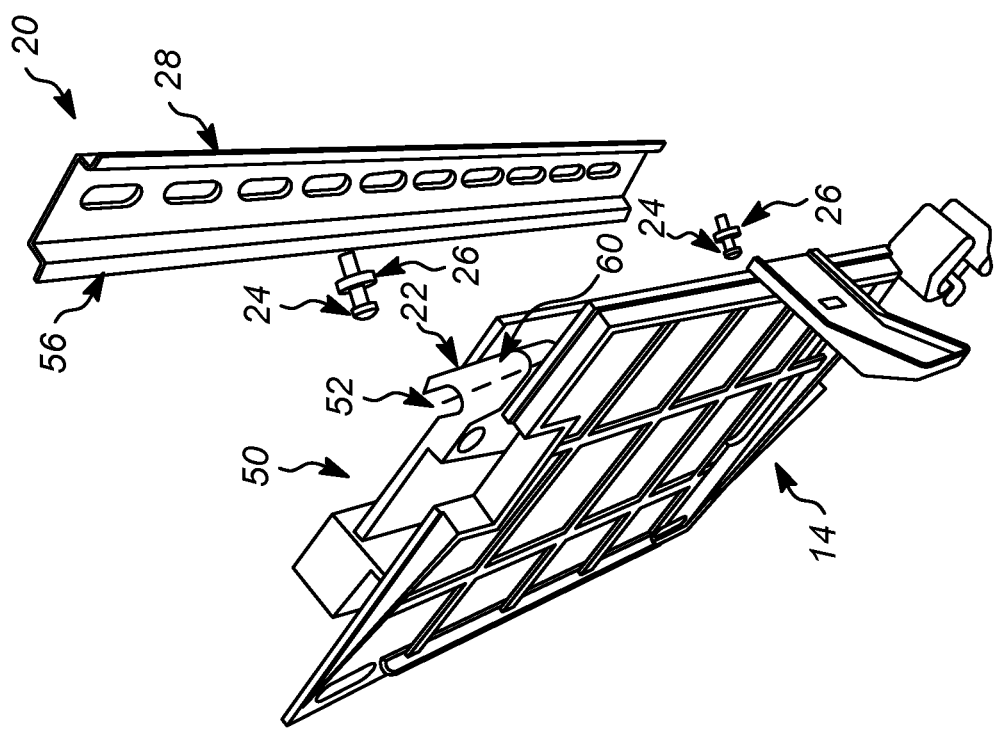

As shown in FIG. 9, the base 14 is configured to be secured to a support rail 20. A typical support rail 20 may be a DIN rail. Typically, the housing 12 is configured to be mounted to the base 14 after the base is secured to the support rail 20. The base 14 includes an opening 22 through which a pin 24 such as a bolt extends to engage a plate 26 such as a nut to cooperatively grip a first flange 28 on the support rail 20 as shown in FIGS. 9 and 10. The base 14 may also include an additional opening 22 through which an additional pin 24 such as a bolt extends to engage an additional plate 26 such as a nut to cooperatively grip the first flange 28 on the support rail 20 as shown in FIGS. 9 and 10.

Figure 11:
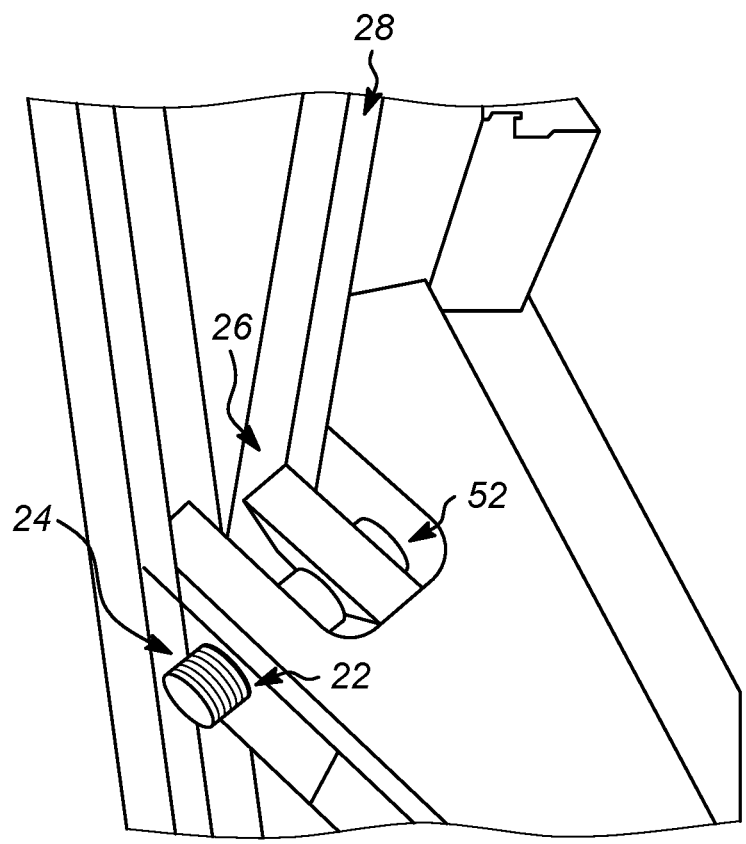
Figure 12:
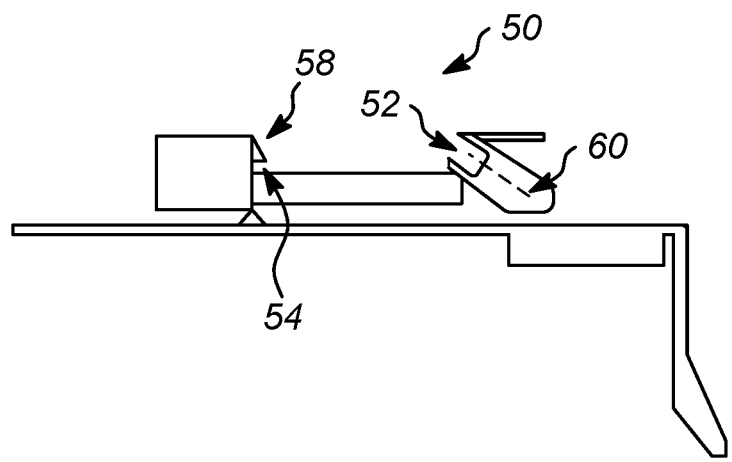

As shown in FIGS. 9-12, the base 14 includes a recess 50 for receiving the support rail 20. A groove 52 on a first side of the 50 recess accepts a first flange 28 on a first edge of the support rail 20, and a channel 54 on a second side of the recess 50 receives a second flange 56 on a second edge of the support rail 20. The channel 54 can be seen in FIG. 12 to be defined by one or more lips 58 protruding into the recess 50 from the second side. The channel 54 receives the second flange 56 in a first received position and the base 14 and the support rail 20 pivot with respect to each other such that the groove 52 receives the first flange 28 of the support rail 20 in a secured position in which the pin 24 can engage the plate 26 to secure the base 14 to the support rail 20. A longitudinal axis 60 of the groove 52 may define an acute angle with a plane defined by said recess 50 to ease entry of said first flange 28 into the groove 52. The plate 26 may comprise an internally threaded nut. Moreover, the plate 26 may comprise an internally threaded nut with a flat edge that may engage a flat side of the groove 52 to enable tightening of a pin, which may be an externally threaded bolt, without having to hold the nut against rotation while tightening the bolt, as shown in FIG. 11.

Figure 15:
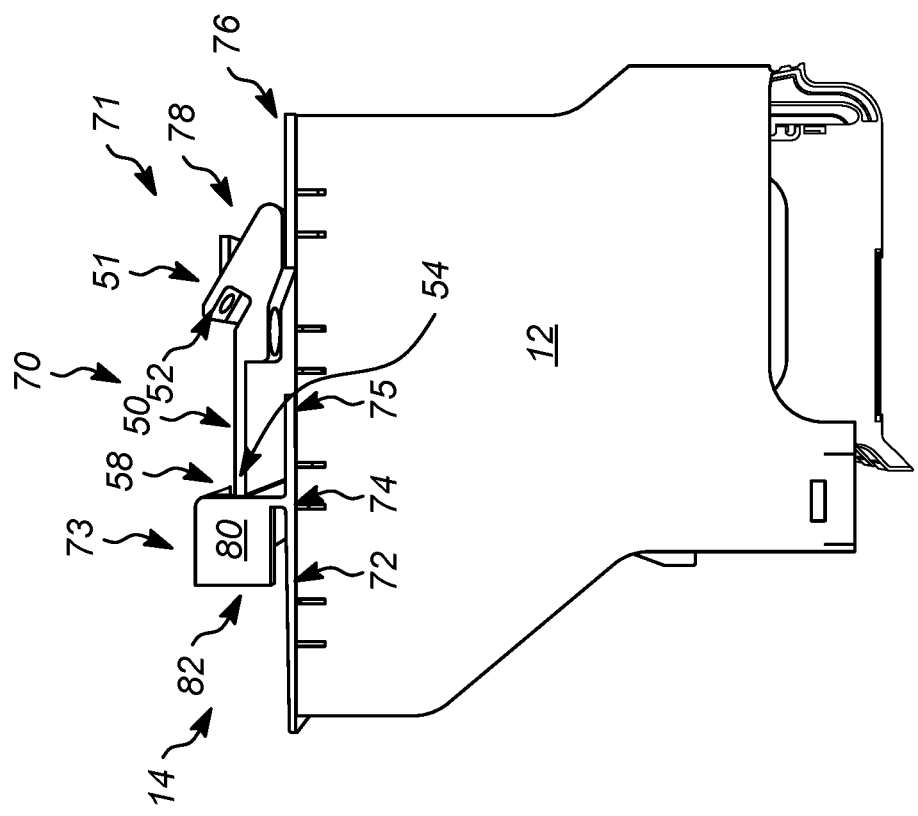
Figure 16:
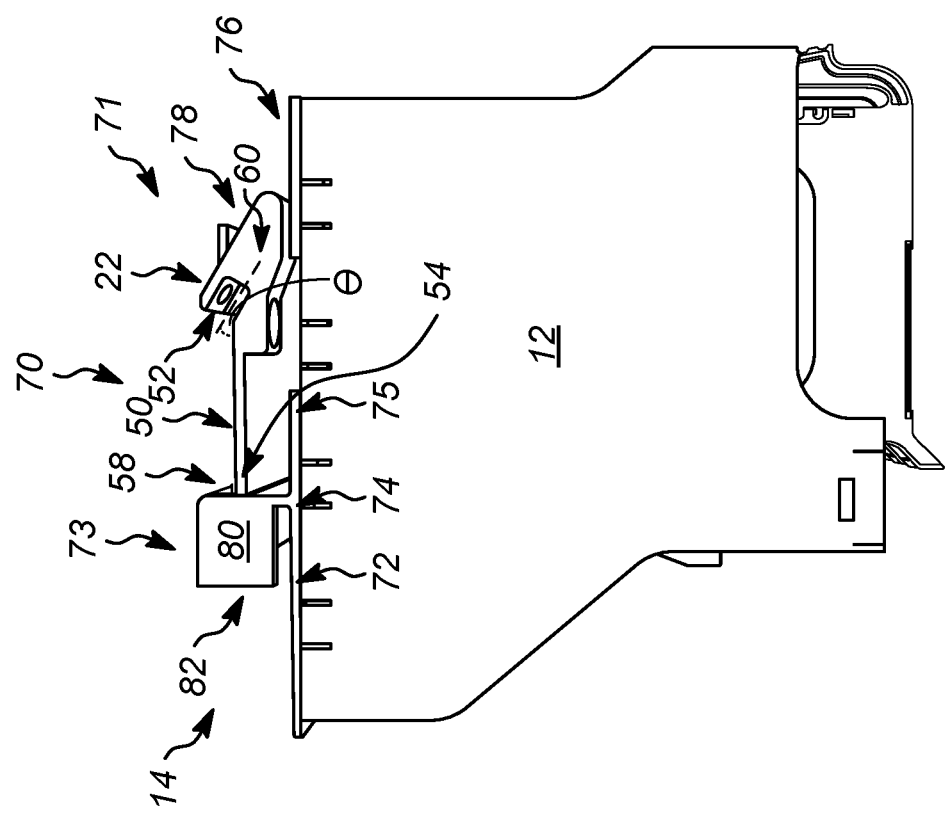

The base 14 may be equipped with a dampening feature. As shown in FIGS. 15 and 16, the base 14 comprises a lever 70 and a mount 72. The lever 70 is configured to be removably secured to the support rail 20 at a first end 71 as previously described and a second end 73 of the lever 70 is attached to the mount 72. The housing 12 is configured to be mounted to the mount 72. The lever 70 is attached to the mount 72 at a fulcrum 74 which is configured and dimensioned to enable the lever 70 to pivot on the fulcrum 74. The mount 72 has a top 75 to which said housing 12 is configured to be mounted and a bottom 76 to which said lever 70 is attached by the fulcrum 74. FIGS. 15 and 16 are oriented such that the top 75 is down and the bottom 76 is up.

The dampening action of the base 14 is provided as follows. The lever 70 includes a foot 78 at the first end 71. The foot 78 is normally in a resting position spaced apart from the bottom 76 of the mount 72 as shown in FIG. 15. The foot 78 may pivot by action of the lever 70 about the fulcrum 74 from the resting position to a flexed position in engagement with the bottom 76 of the mount as shown in FIG. 16. Hence, when the base 14 is mounted to the support rail 20, as previously described, the levering action of the lever 70 cushions or dampens the housing 12 and its electronic components against vibrations and other impacts typically encountered during transportation and operation. The second end 73 of the lever 70 includes a stop 80 which prevents the first end 71 of the lever from pivoting excessively away from engagement with the bottom 76 of the mount 72, which may tend to strain the fulcrum 74. The stop 80 has a distal end 82 opposite the fulcrum toward the second end 73 of the lever 70 which will engage the bottom 76 of the mount 72 if the lever 70 is pivoted excessively counterclockwise.

The securement of the base 14 to the support rail 20 can be explained in more detail in light of FIGS. 15 and 16. The recess 50 in the base 14 that receives the support rail 20 shown in FIG. 9 is provided in a bottom of the lever 70. The groove 52 that accepts the first flange 28 of the support rail 20 shown in FIG. 9 is on the first side of the recess 50. The opening 22 through which the pin 24 can be extended to engage a plate 26 to cooperatively grip the flange 28 on the support rail 20, as shown in FIGS. 9-11, is in the first end 71 of the lever 70. The channel 54, shown in FIG. 12, on the second side of the recess 70 that receives the second flange 56 of the support rail 20 is provided between lever 70, specifically the recess 50, and the lips 58. The acute angle Θ the longitudinal axis 60 of the groove 52 defines with a plane defined by the recess 50 can be seen in FIG. 15.

Figure 13:
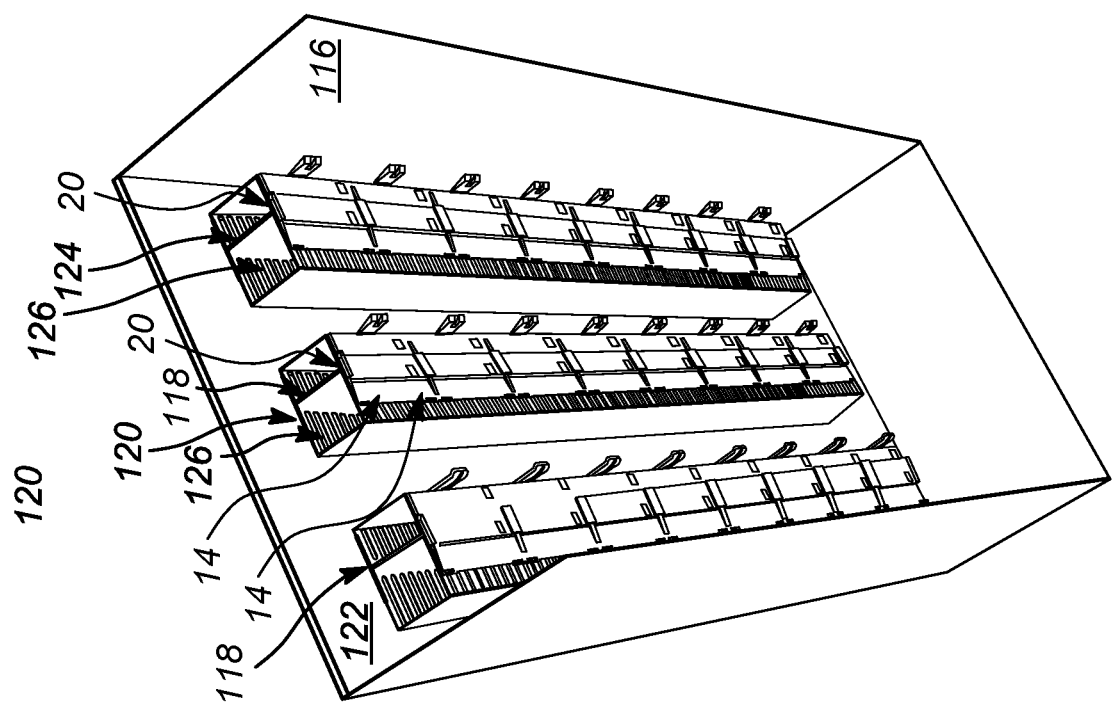

As shown in FIG. 13, a support rail 20 may be located in a cabinet 116. For example, the support rail 20 may be integrated into an I-beam 118 with a cabinet flange 120 of the I-beam fastened to a surface 122 in the cabinet 116. The support rail 20 is opposed to the cabinet flange 120 and connected to the cabinet flange by the web 124. A cabinet 116 may contain more than one support rail 20. Therefore, the cabinet may contain more than one I-beam 118. A plurality of bases 14 may be secured to the support rail 20 in the cabinet 116. An I-beam 118 may extend the height of the cabinet 116 to support a plurality of bases 14 on a single support rail 20. A cable duct 126 may be nested between the base flange 120, the web 124 and the support rail 20 on three sides of its four sides. The cable duct 126 may have openings or slots on the side adjacent to the support rail 20 to allow entry and exit of cabling which can run along the height of the support rail 20 among a plurality of bases 14 supported thereon. Cable ducts 126 may be disposed on both sides of the web 124 of the I-beam. Openings may also be provided on a side of the cable duct adjacent to the surface 122 of the cabinet 116.

A process for mounting the field termination assembly 114 to the support rail 20 comprises securing the base 14 to the support rail as shown in FIG. 13. A process for mounting a plurality of the field termination assemblies 114 to the support rail 20 comprises securing a plurality of the bases 14 to the support rail as shown in FIG. 13. A process for mounting a plurality of the field termination assemblies 114 to the support rail 20 comprises securing a plurality of the bases 14 to respective ones of a plurality of support rails as shown in FIG. 13.

Figure 14:
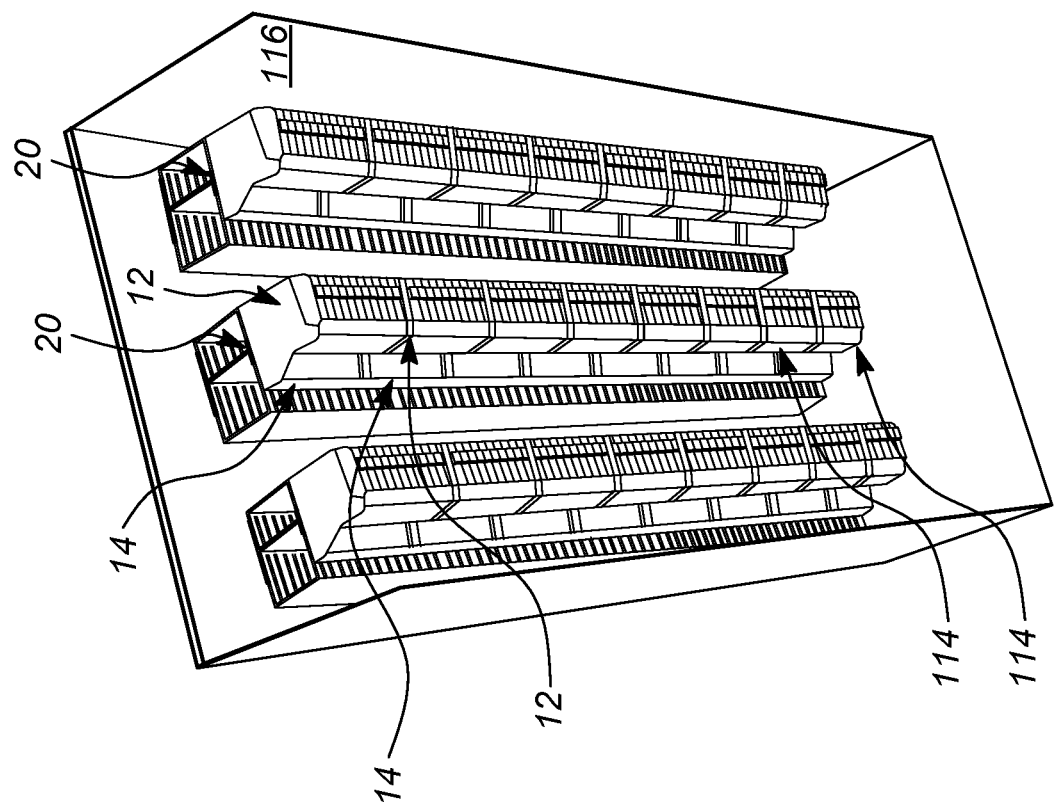

As shown in FIG. 14, respective ones of a plurality of housings 12 may be mounted on respective ones of the plurality of bases 14. Moreover, respective ones of a plurality of housings 12 may be mounted on respective ones of the plurality of bases 14 which are mounted on respective ones of a plurality of support rails 20. Hence, the process of mounting the field termination assembly 114 to the support rail 20 comprises mounting the housing 12 on the base 14.

Referring to FIG. 7, the catch 32 on the housing 12 engages the loop 30 on the base 14 in a first coupled position. As shown in FIG. 8, the 12 housing and the base 14 pivot with respect to each other into the second mounted position. The latch 36 on the base 14 engages a hitch 34 on the housing in the second mounted position. Hence, the housing 12 is easily mounted onto the base 14 when the housing is loaded with adaptor modules 18 into the respective slots 16 and when the base 14 is secured to a support rail 20. Moreover, the housing 12 is easily dismounted from the base 14 when the housing is loaded with adaptor modules 18 into the respective slots 16 and when the base 14 is secured to a support rail 20.

Each field termination assembly 114 can further include at least one cable duct 126. The cable duct allows cables (such as cables coupling the field termination assembly 114 to sensors 102a, actuators 102b, or other field devices or to controllers 106) to be routed in a safe and concealed manner. Also, in some embodiments, the field termination assembly 114 can be assembled from multiple parts to form an integrated physical subsystem, and the assembled subsystem can then be mounted (such as to a cabinet). The assembled subsystem allows cables to pass through the cable duct, which can help make installation and maintenance easier. In some embodiments, the cables can be routed through a cable duct so that the cables are accommodated behind a base of a field termination assembly 114. This allows for the use of more field termination assemblies 114 in lateral directions or for easier isolation of the cables from one another.

Various other features can also be used with each field termination assembly 114. For example, slots of the field termination assembly 114 could be bypassed, such as when an adaptor module is implemented externally and coupled to the field termination assembly 114. As another example, the field termination assembly 114 and its cabling can comply with any suitable hazardous location (HazLoc) requirements. As yet another example, the field termination assembly 114 can include at least one printed circuit board (PCB) forming the backplane, and a safety earth ground connection to the PCB can be made with a rail, cabinet, or other structure without any additional cabling of clips. As still another example, adequate insulation can be provided on fuse and disconnect terminals of the field termination assembly 114 to avoid exposing high-voltage terminals to an operator while opening or after opening one or more of the fuse/disconnect levers. This can help to protect the operator from high-voltage or thermal hazards, which can be useful when the field devices coupled to the field termination assembly 114 are of the high-voltage type.

In some embodiments, one or more field termination assemblies 114 can be used in a marshaling cabinet 116 or other marshaling structure. The marshaling structure can include additional components to support various functions, such as signal conditioning and protection of I/O channels. Note, however, that the field termination assemblies 114 can be used in any other suitable manner.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f). While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

Specific Embodiments

While the following is described in conjunction with specific embodiments, it will be understood that this description is intended to illustrate and not limit the scope of the preceding description and the appended claims.

A first embodiment of the disclosure is an apparatus comprising a field termination assembly comprising a housing including one or more slots, each slot configured to receive a respective adaptor module configured to be inserted into the slot, the adaptor module configured to perform at least one function related to an associated input or output signal; a base comprising a lever configured to be secured to a support rail at a first end and a mount, a second end of the lever being attached to the mount; and the housing being configured to be mounted to the mount. An embodiment of the disclosure is one, any or all of prior embodiments in this paragraph up through the first embodiment in this paragraph, wherein the mount has a top to which the housing is configured to be mounted and a bottom to which the lever is attached. An embodiment of the disclosure is one, any or all of prior embodiments in this paragraph up through the first embodiment in this paragraph, wherein the lever is attached to the mount at a fulcrum, the lever being pivotable on the fulcrum. An embodiment of the disclosure is one, any or all of prior embodiments in this paragraph up through the first embodiment in this paragraph wherein the lever includes a foot at the first end, the foot may pivot from a resting position spaced apart from the bottom to a flexed position in engagement with the bottom. An embodiment of the disclosure is one, any or all of prior embodiments in this paragraph up through the first embodiment in this paragraph wherein the base includes a recess in a bottom of the lever for receiving a support rail, a groove on a first side of the recess accepts a flange of the support rail. An embodiment of the disclosure is one, any or all of prior embodiments in this paragraph up through the first embodiment in this paragraph, wherein the first end of the lever includes an opening through which a pin extends to engage a plate to cooperatively grip the flange on the support rail. An embodiment of the disclosure is one, any or all of prior embodiments in this paragraph up through the first embodiment in this paragraph, wherein the flange comprises a first flange, and a channel on a second side of the recess receives a second flange of the support rail. An embodiment of the disclosure is one, any or all of prior embodiments in this paragraph up through the first embodiment in this paragraph wherein the channel receives the second flange in a first received position and the base and the support rail pivot with respect to each other such that the groove receives the first flange of the support rail in a secured position in which the pin can engage the plate to secure the base to the support rail. An embodiment of the disclosure is one, any or all of prior embodiments in this paragraph up through the first embodiment in this paragraph in which the groove defines an acute angle with a plane defined by the recess. An embodiment of the disclosure is one, any or all of prior embodiments in this paragraph up through the first embodiment in this paragraph, wherein the second end of the lever includes a stop which prevents the first end of the lever from pivoting excessively away from engagement with the bottom of the mount. An embodiment of the disclosure is one, any or all of prior embodiments in this paragraph up through the first embodiment in this paragraph, wherein the mount includes a loop and the housing includes a catch configured to engage the loop in a first coupled position and the housing includes a hitch and the base includes a latch, the housing and the base pivot with respect to each other to enable the latch to engage the hitch to mount the base to the housing in a second mounted position.

A second embodiment of the disclosure is an apparatus comprising a field termination assembly comprising a housing including one or more slots, each slot configured to receive a respective adaptor module configured to be inserted into the slot, the adaptor module configured to perform at least one function related to an associated input or output signal; a base comprising a lever configured to be secured to a support rail at a first end and a mount, a second end of the lever being attached to the mount at a fulcrum, the lever being pivotable on the fulcrum; and the housing being configured to be mounted to the mount. An embodiment of the disclosure is one, any or all of prior embodiments in this paragraph up through the second embodiment in this paragraph, wherein the mount has a top to which the housing is configured to be mounted and a bottom to which the lever is attached. An embodiment of the disclosure is one, any or all of prior embodiments in this paragraph up through the second embodiment in this paragraph wherein the lever includes a foot at the first end, the foot may pivot from a resting position spaced apart from the bottom to a flexed position in engagement with the bottom. An embodiment of the disclosure is one, any or all of prior embodiments in this paragraph up through the second embodiment in this paragraph wherein the base includes a recess in a bottom of the lever for receiving a support rail, a groove on a first side of the recess accepts a flange of the support rail. An embodiment of the disclosure is one, any or all of prior embodiments in this paragraph up through the second embodiment in this paragraph, wherein the first end of the lever includes an opening through which a pin extends to engage a plate to cooperatively grip the flange on the support rail. An embodiment of the disclosure is one, any or all of prior embodiments in this paragraph up through the second embodiment in this paragraph, wherein the flange comprises a first flange, and a channel on a second side of the recess receives a second flange of the support rail. An embodiment of the disclosure is one, any or all of prior embodiments in this paragraph up through the second embodiment in this paragraph wherein the channel receives the second flange in a first received position and the base and the support rail pivot with respect to each other such that the groove receives the first flange of the support rail in a secured position in which the pin can engage the plate to secure the base to the support rail. An embodiment of the disclosure is one, any or all of prior embodiments in this paragraph up through the second embodiment in this paragraph in which the groove defines an acute angle with a plane defined by the recess.

A third embodiment of the disclosure is an apparatus comprising a field termination assembly comprising a housing including one or more slots, each slot configured to receive a respective adaptor module configured to be inserted into the slot, the adaptor module configured to perform at least one function related to an associated input or output signal; a base comprising a lever configured to be secured to a support rail at a first end and a mount, a second end of the lever being attached to the mount; the housing being configured to be mounted to the mount, the mount including a loop and the housing including a catch configured to engage the loop in a first coupled position and the housing including a hitch and the base includes a latch, the housing and the base pivot with respect to each other to enable the latch to engage the hitch to mount the base to the housing in a second mounted position.

Without further elaboration, it is believed that using the preceding description that one skilled in the art can utilize the present disclosure to its fullest extent and easily ascertain the essential characteristics of this disclosure, without departing from the spirit and scope thereof, to make various changes and modifications of the disclosure and to adapt it to various usages and conditions. The preceding preferred specific embodiments are, therefore, to be construed as merely illustrative, and not limiting the remainder of the disclosure in any way whatsoever, and that it is intended to cover various modifications and equivalent arrangements included within the scope of the appended claims.

In the foregoing, all temperatures are set forth in degrees Celsius and, all parts and percentages are by weight, unless otherwise indicated.

What is claimed is:

1. An apparatus comprising a field termination assembly comprising:
    a housing including one or more slots, each slot of the one or more slots is configured to receive a respective adaptor module configured to be inserted into said slot, said adaptor module configured to perform at least one function related to an associated input or output signal;
    a base comprising a lever configured to be secured to a support rail at a first end and a mount, a second end of said lever being attached to said mount, wherein said lever includes a foot at said first end, said foot is configured to pivot from a resting position spaced apart from a bottom of said mount to a flexed position in engagement with said bottom; and
    said housing being configured to be mounted to said mount.

2. The apparatus of claim 1, wherein said mount has a top to which said housing is configured to be mounted and said bottom to which said lever is attached.

3. The apparatus of claim 2, wherein said lever is attached to said mount at a fulcrum, said lever being pivotable on said fulcrum.

4. The apparatus of claim 1 wherein said base includes a recess in a bottom of said lever for receiving a support rail, a groove on a first side of said recess accepts a flange of the support rail.

5. The apparatus of claim 4, wherein the first end of the lever includes an opening through which a pin extends to engage a plate to cooperatively grip the flange on the support rail.

6. The apparatus of claim 4, wherein the flange comprises a first flange, and a channel on a second side of said recess receives a second flange of said support rail.

7. The apparatus of claim 6 wherein said channel receives said second flange in a first received position and said base and said support rail pivot with respect to each other such that said groove receives said first flange of said support rail in a secured position in which said pin can engage said plate to secure said base to said support rail.

8. The apparatus of claim 4 in which said groove defines an acute angle with a plane defined by said recess.

9. The apparatus of claim 1, wherein said second end of said lever includes a stop which prevents the first end of the lever from pivoting excessively away from engagement with the bottom of the mount.

10. The apparatus of claim 4, wherein said mount includes a loop and said housing includes a catch configured to engage said loop in a first coupled position and the housing includes a hitch and said base includes a latch, said housing and said base pivot with respect to each other to enable said latch to engage said hitch to mount said base to said housing in a second mounted position.

11. An apparatus comprising a field termination assembly comprising:
    a housing including one or more slots, each slot of the one or more slots is configured to receive a respective adaptor module configured to be inserted into said slot, said adaptor module configured to perform at least one function related to an associated input or output signal;
    a base comprising a lever configured to be secured to a support rail at a first end and a mount, a second end of said lever being attached to said mount at a fulcrum, said lever being pivotable on said fulcrum, wherein said lever includes a foot at said first end, said foot is configured to pivot from a resting position spaced apart from a bottom of said mount to a flexed position in engagement with said bottom; and
    said housing being configured to be mounted to said mount.

12. The apparatus of claim 11, wherein said mount has a top to which said housing is configured to be mounted and said bottom to which said lever is attached.

13. The apparatus of claim 12 wherein said lever includes a foot at the first end, the foot may pivot from a resting position spaced apart from said bottom to a flexed position in engagement with said bottom.

14. The apparatus of claim 13 wherein said base includes a recess in a bottom of the lever for receiving a support rail, a groove on a first side of said recess accepts a flange of the support rail.

15. The apparatus of claim 14, wherein the first end of the lever includes an opening through which a pin extends to engage a plate to cooperatively grip the flange on the support rail.

16. The apparatus of claim 14, wherein the flange comprises a first flange, and a channel on a second side of said recess receives a second flange of said support rail.

17. The apparatus of claim 16 wherein said channel receives said second flange in a first received position and said base and said support rail pivot with respect to each other such that said groove receives said first flange of said support rail in a secured position in which said pin can engage said plate to secure said base to said support rail.

18. The apparatus of claim 14 in which said groove defines an acute angle with a plane defined by said recess.

19. An apparatus comprising a field termination assembly comprising:

a housing including one or more slots, each slot configured to receive a respective adaptor module configured to be inserted into said slot, said adaptor module configured to perform at least one function related to an associated input or output signal;

a base comprising a lever configured to be secured to a support rail at a first end and a mount, a second end of said lever being attached to said mount, wherein said lever includes a foot at said first end, said foot is configured to pivot from a resting position spaced apart from a bottom of said mount to a flexed position in engagement with said bottom;

said housing being configured to be mounted to said mount, said mount including a loop and said housing including a catch configured to engage said loop in a first coupled position and the housing including a hitch and said base includes a latch, said housing and said base pivot with respect to each other to enable said latch to engage said hitch to mount said base to said housing in a second mounted position.

\* \* \* \* \*

UNITED STATES PATENT AND TRADEMARK OFFICE
CERTIFICATE OF CORRECTION

Page 1 of 1

PATENT NO. : 11,622,465 B2
APPLICATION NO. : 16/776251
DATED : April 4, 2023
INVENTOR(S) : Dawa Pakimo, Jaison Cherian and Peter Vermaas It is certified that error appears in the above-identified patent and that said Letters Patent is hereby corrected as shown below:

On the Title Page

Under "(65) Prior Publication Data US 2020/0253076 A1 Aug. 6 , 2020", please insert:
--(30) Foreign Application Priority Data
Jan. 31, 2019 (IN) ............... 201911003912--.

Signed and Sealed this
Third Day of September, 2024

Katherine Kelly Vidal
*Director of the United States Patent and Trademark Office*